United States Patent
Song

(10) Patent No.: US 8,633,508 B2
(45) Date of Patent: Jan. 21, 2014

(54) SEMICONDUCTOR ELEMENT AND A PRODUCTION METHOD THEREFOR

(75) Inventor: June O Song, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 424 days.

(21) Appl. No.: 12/990,943

(22) PCT Filed: May 4, 2009

(86) PCT No.: PCT/KR2009/002353
§ 371 (c)(1),
(2), (4) Date: Feb. 28, 2011

(87) PCT Pub. No.: WO2009/136718
PCT Pub. Date: Nov. 12, 2009

(65) Prior Publication Data
US 2011/0140102 A1    Jun. 16, 2011

(30) Foreign Application Priority Data
May 4, 2008  (KR) .................. 10-2008-0041605

(51) Int. Cl.
*H01L 29/24*   (2006.01)
(52) U.S. Cl.
USPC ......... 257/103; 257/79; 257/E33.013; 438/46

(58) Field of Classification Search
USPC .............. 257/43, 79, 103, E33.002, E33.013; 438/22, 46, 47
See application file for complete search history.

(56) References Cited

U.S. PATENT DOCUMENTS 4,978,052 A * 12/1990 Fister et al. ............. 228/123.1
5,262,920 A    11/1993 Sakuma et al.
6,045,626 A *  4/2000 Yano et al. .............. 148/33.4

OTHER PUBLICATIONS

Ali, I., et al. Properties of Semiconducting Rhenium Silicide Thin Films Grown Epitaxially on Silicon (111), *Applied Surface Science*, Aug. 1996, 102:147-150.
International Search Report dated Nov. 19, 2009 for International Application No. PCT/KR2009/002353.

* cited by examiner

*Primary Examiner* — Matthew E Warren
(74) *Attorney, Agent, or Firm* — KED & Associates LLP

(57) ABSTRACT

A semiconductor device according to the embodiment includes a growth substrate; a first buffer layer having a compositional formula of $Re_xSi_y$ ($0 \leq x \leq 2$, $0 \leq y \leq 2$) over the growth substrate; and a group III nitride-based epitaxial semiconductor layer having a compositional formula of $In_xAl_yGa_{1-x-y}N$ ($0 \leq x$, $0 \leq y$, $x+y \leq 1$) over the first buffer layer.

20 Claims, 3 Drawing Sheets

SEMICONDUCTOR ELEMENT AND A PRODUCTION METHOD THEREFOR

1. TECHNICAL FIELD

The disclosure relates to a semiconductor device and a manufacturing method thereof.

2. BACKGROUND ART

Recently, a light emitting diode (LED) is spotlighted as a light emitting device. Since the LED can convert electric energy into light energy with high efficiency and long life span of about 5 years or more, the LED can remarkably reduce the energy consumption and repair and maintenance cost. In this regard, the LED is spotlighted in the next-generation lighting field.

Such an LED includes a buffer layer formed on a growth substrate having a hexagonal crystal system, such as a sapphire substrate, a silicon carbide (SiC) substrate or a silicon (Si) substrate. In addition, a light emitting semiconductor layer including a first conductive semiconductor layer, an active layer and a second conductive semiconductor layer is formed on the buffer layer. The LED may include a group III nitride epitaxial semiconductor and the active layer may emit light as current is applied thereto through the first and second conductive semiconductor layers.

However, if the group III nitride epitaxial semiconductor is formed on the growth substrate, the crack or warpage may occur in the group III nitride epitaxial semiconductor and the dislocation is generated due to the difference in lattice constant and thermal expansion coefficient between the group III nitride epitaxial semiconductor and the growth substrate.

In particular, if the group III nitride epitaxial semiconductor is grown on a silicon growth substrate, the crystal property of the group III nitride epitaxial semiconductor may be degraded and the crack and the dislocation may occur due to the great difference in lattice constant and thermal expansion coefficient between the group III nitride epitaxial semiconductor and the silicon growth substrate.

For example, nitride gallium (GaN), which is the representative group III nitride epitaxial semiconductor, has the thermal expansion coefficient of $5.59 \times 10^6$/K and the lattice constant of 3.189 Å. In contrast, the silicon growth substrate having the crystal plane [111] has the thermal expansion coefficient of $2.50 \times 10^6$/K and the lattice constant of 3.84 Å.

That is, the silicon growth substrate has the difference in thermal expansion coefficient of about 53.6% and lattice constant of about 16.9% when comparing with the nitride gallium (GaN). Thus, the great dislocation may occur in the GaN layer grown on the silicon growth substrate due to the difference in lattice constant and the crack may occur in the GaN layer due to the difference in thermal expansion coefficient.

In particular, when the GaN layer grown under the high temperature is cooled, the tensile stress is applied to the GaN layer due to the difference in thermal expansion coefficient, so that the crack may occur in the GaN layer. The crack may deteriorate the crystal property of the GaN layer and may interfere with electrons or holes being injected, thereby degrading the performance of the LED.

DISCLOSURE

Technical Problem

The embodiment provides a semiconductor device having a novel structure and a manufacturing method thereof.

The embodiment provides a semiconductor device capable of improving electric characteristics and a manufacturing method thereof.

Technical Solution

A semiconductor device according to the embodiment may include a growth substrate; a first buffer layer having a compositional formula of $Re_xSi_y$ ($0 \leq x \leq 2$, $0 \leq y \leq 2$) over the growth substrate; and a group III nitride-based epitaxial semiconductor layer having a compositional formula of $In_xAl_yGa_{1-x-y}N$ ($0 \leq x$, $0 \leq y$, $x+y \leq 1$) over the first buffer layer.

A semiconductor device according to the embodiment may include a silicon growth substrate; a first buffer layer having a compositional formula of $Re_xSi_y$ ($0 \leq x \leq 2$, $0 \leq y \leq 2$) over the silicon growth substrate; a second buffer layer including GaN or AlN over the first buffer layer; and a first conductive semiconductor layer, an active layer and a second conductive semiconductor layer over the second buffer layer.

A method of manufacturing a semiconductor device according to the embodiment may include the steps of forming a buffer layer including a compound having a compositional formula of $Re_xSi_y$ ($0 \leq x \leq 2$, $0 \leq y \leq 2$) over a growth substrate; forming a light emitting semiconductor layer including a first conductive semiconductor layer, an active layer and a second conductive semiconductor layer over the buffer layer; forming an ohmic contact reflective layer over the second conductive semiconductor layer; forming a conductive wafer bonding layer and a conductive support substrate over the ohmic contact reflective layer; removing the growth substrate and the buffer layer; and forming a first electrode layer over the first conductive semiconductor layer.

Advantageous Effects

The embodiment can provide a semiconductor device having a novel structure and a manufacturing method thereof.

The embodiment can provide a semiconductor device capable of improving electric characteristics and a manufacturing method thereof.

BEST MODE

[Mode for Invention]

Figure 1:
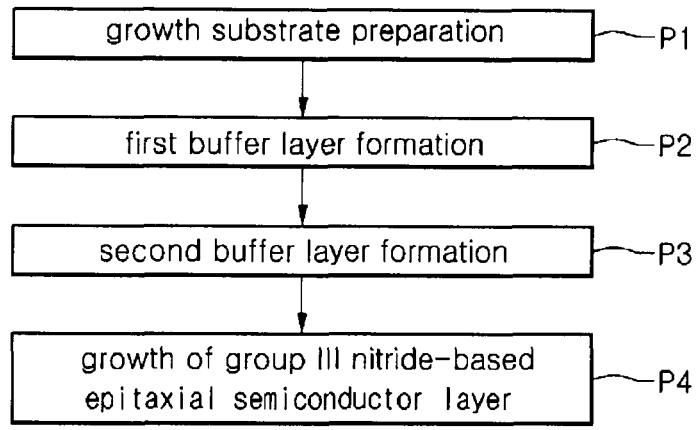
FIGS. 1 and 2 are views showing the method of manufacturing a semiconductor device according to the embodiment.

In the description of the embodiments, it will be understood that, when a layer (or film), a region, a pattern, or a structure is referred to as being "on" or "under" another substrate, another layer (or film), another region, another pad, or another pattern, it can be "directly" or "indirectly" on the other substrate, layer (or film), region, pad, or pattern, or one or more intervening layers may also be present. Such a position of the layer has been described with reference to the drawings.

The thickness and size of each layer shown in the drawings may be exaggerated, omitted or schematically drawn for the purpose of convenience or clarity. In addition, the size of elements does not utterly reflect an actual size.

Figure 2:
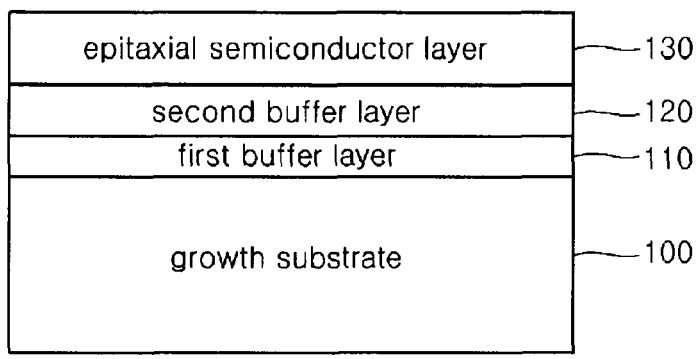

FIGS. 1 and 2 are views showing the method of manufacturing a semiconductor device according to the embodiment.

Referring to FIGS. 1 and 2, a growth substrate 100 is prepared (P1).

The growth substrate 100 may include one selected from the group consisting of sapphire, SiC, ZnO, GaAs, GaN, Si, $LiAlO_2$, and $LiGaO_2$. For instance, the growth substrate 100 may be selected from a sapphire growth substrate, a SIC growth substrate and a Si growth substrate.

Then, a first buffer layer 110 and a second buffer layer 120 are formed on the growth substrate 100 (P2 and P3).

The first buffer layer 110 may include one selected from materials having a compositional formula of $In_xAl_yGa_{1-x-y}N$ (0≤x, 0≤y, x+y≤1) or $Re_xSi_y$ (0≤x≤2, 0≤y≤2), and the second buffer layer 120 may include the other one selected from materials having a compositional formula of $In_xAl_yGa_{1-x-y}N$ (0≤x, 0≤y, x+y≤1) or $Re_xSi_y$ (0≤x≤2, 0≤y≤2).

The first and second buffer layers 110 and 120 are formed through the chemical vapor deposition (CVD) or the physical vapor deposition (PVD) with a thickness of about 10 nm to 1000 nm.

Then, an epitaxial semiconductor layer 130 is formed on the second buffer layer 120 (P4).

The epitaxial semiconductor layer 130 includes a group III nitride-based epitaxial semiconductor layer having a compositional formula of $In_xAl_yGa_{1-x-y}N$ (0≤x, 0≤y, x+y≤1). The epitaxial semiconductor layer 130 can be prepared as a single layer structure or a multiple layer structure to manufacture an electric device or a light emitting device. For instance, the epitaxial semiconductor layer 130 may include a first conductive semiconductor layer, an active layer, and a second conductive semiconductor layer.

Figure 3:
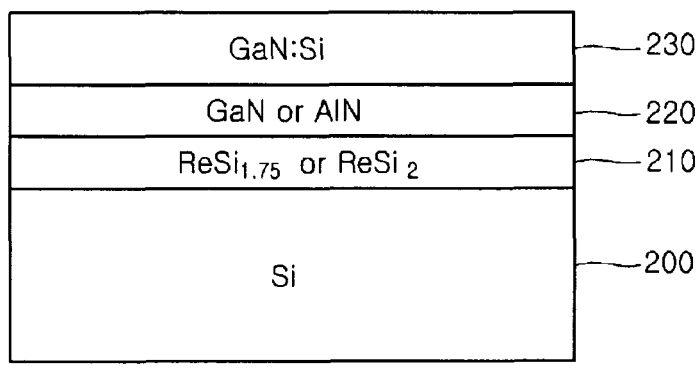
FIG. 3 is a view showing a semiconductor device according to the first embodiment.

FIG. 3 is a view showing the semiconductor device according to the first embodiment.

Referring to FIG. 3, rhenium or rhenium silicide is deposited at the thickness of 10 nm to 1000 nm on a silicon growth substrate 200 having the plane orientation [111] through the PVD, such as sputtering or evaporation, or the CVD, such as MOCVD, HVPE, MBE or ALD. Then, a compound having a chemical formula similar to $ReSi_{1.75}$ or $ReSi_2$ is formed through the heat treatment process to form the first buffer layer 210.

Then, the second buffer layer 220 including GaN or AlN is formed on the first buffer layer 210 through the CVD, such as MOCVD, HVPE or MBE.

Subsequently, a GaN layer 230 doped with silicon is formed on the second buffer layer 220 as the first conductive semiconductor layer through the CVD, such as MOCVD, HVPE or MBE.

Although not shown in the drawing, the active layer and the second conductive semiconductor layer can be further formed on the GaN layer 230.

Figure 4:
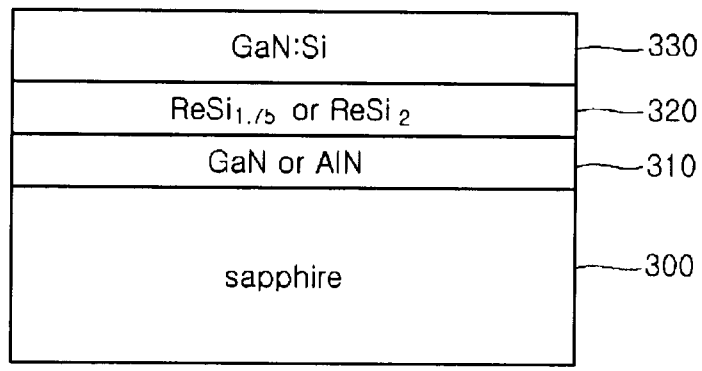
FIG. 4 is a view showing a semiconductor device according to the second embodiment.

FIG. 4 is a view showing a semiconductor device according to the second embodiment.

Referring to FIG. 4, GaN or AlN is formed on a silicon growth substrate 300 having the plane orientation [111] through the CVD, such as MOCVD, HVPE or MBE and the heat treatment process is performed to form a first buffer layer 310.

Then, a compound having a chemical formula similar to $ReSi_{1.75}$ or $ReSi_2$ is deposited on the first buffer layer 310 through the PVD, such as sputtering or evaporation, or the CVD, such as MOCVD, HVPE, MBE or ALD, thereby forming a second buffer layer 320.

Subsequently, a GaN layer 330 doped with silicon is formed on the second buffer layer 320 as the first conductive semiconductor layer through the CVD, such as MOCVD, HVPE or MBE.

Although not shown in the drawing, the active layer and the second conductive semiconductor layer can be further formed on the GaN layer 330.

The silicon growth substrate is most extensively used in the semiconductor manufacturing process because the silicon growth substrate represents superior thermal conductivity with a low cost while enabling fabrication of large-size wafers.

According to the embodiment, the silicon growth substrate 200 having the plane orientation [100] or [110] can be employed in addition to the silicon growth substrate 200 having the plane orientation [111]. The plane of the silicon growth substrate 200 having the plane orientation [111] has the lattice constant of about 3.84 Å. In contrast, the plane of the silicon growth substrate 200 having the plane orientation [100] has the lattice constant of about 5.40 Å.

Thus, since the GaN has the lattice constant of about 3.189 Å, the silicon growth substrate 200 having the plane orientation [111] is suitable for directly growing the group III nitride-based epitaxial semiconductor material.

However, according to the embodiment, since the buffer layer including at least one layer having the compositional formula of $Re_xSi_y$ (0≤x≤2, 0≤y≤2) is formed on the silicon growth substrate 200 before the group III nitride-based epitaxial semiconductor material is grown on the silicon growth substrate 200, the silicon growth substrate 200 having the plane orientation [100] or [110] can be used as well as the silicon growth substrate 200 having the plane orientation [111].

Among the compounds used for the first buffer layer or second buffer layer and having the compositional formula of $Re_xSi_y$ (0≤x≤2, 0≤y≤2), the $ReSi_{1.75}$ layer or the $ReSi_2$ layer has the triclinic crystal system, the orthorhombic crystal system or the tetragonal crystal system according to the formation method thereof.

Regardless of the crystal system, the $ReSi_{1.75}$ layer or the $ReSi_2$ layer may have the crystal lattice constant of 0.313 Å at the a-axis in the crystal growth plane and 0.312 Å at the b-axis in the crystal growth plane. In addition, the $ReSi_{1.75}$ layer or the $ReSi_2$ layer may have the thermal expansion coefficient of 4.239+0.0044T at the a-axis, 5.604+0.0039T at the b-axis, and 7.53+0.0012T at the c-axis (T: absolute temperature) in the temperature range of 300 to 1400K. That is, the crystal lattice constant and the thermal expansion coefficient of the $ReSi_{1.75}$ layer or the $ReSi_2$ layer are similar to those of the group III nitride-based epitaxial semiconductor.

Therefore, the buffer layer of the embodiment can be used when the group III nitride-based semiconductor device is manufactured by using the silicon growth substrate, which is inexpensive and can be manufactured in mass-production.

According to the embodiment, the crack or warpage may be reduced and the dislocation may not be generated in the group III nitride-based semiconductor device manufactured by using the growth substrate and the buffer layer. Therefore, the electric characteristics of the semiconductor device including the group III nitride-based semiconductor may be improved.

FIGS. 5 to 9 are views showing the method of manufacturing a group III nitride-based light emitting device using the silicon growth substrate.

If the group III nitride-based light emitting device is manufactured by using the silicon growth substrate, the silicon growth substrate can effectively absorb the light and can be easily separated through the wet etching process, differently from the sapphire growth substrate according to the related art.

Therefore, when taking the optical and physical properties of the silicon growth substrate into consideration, the group III nitride-based light emitting device employing the silicon growth substrate is suitable for the vertical type light emitting device. However, it is also possible to manufacture the lateral type light emitting device by using the silicon growth substrate.

Figure 5:
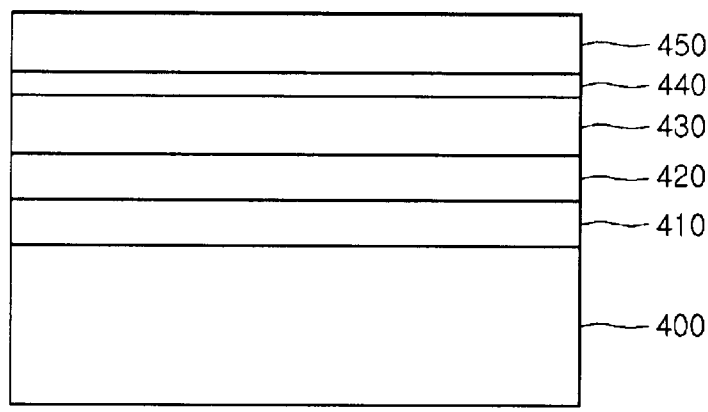
FIGS. 5 to 9 are views showing the method of manufacturing a group III nitride-based light emitting device using a silicon growth substrate.

Referring to FIG. 5, a first buffer layer 410 having a chemical formula similar to $ReSi_{1.75}$ or $ReSi_2$ and a second buffer layer 420 including GaN or AlN are formed on a silicon growth substrate 400.

Then, a light emitting semiconductor layer including a first conductive semiconductor layer 430, an active layer 440 and a second conductive semiconductor layer 450 is formed on the second buffer layer 420.

For instance, the first conductive semiconductor layer 430 may include an n type nitride-based semiconductor layer doped with silicon (Si), the active layer 440 may include a nitride-based semiconductor layer having a quantum well structure, and the second conductive semiconductor layer 450 may include a p type nitride-based semiconductor layer doped with magnesium (Mg).

Figure 6:
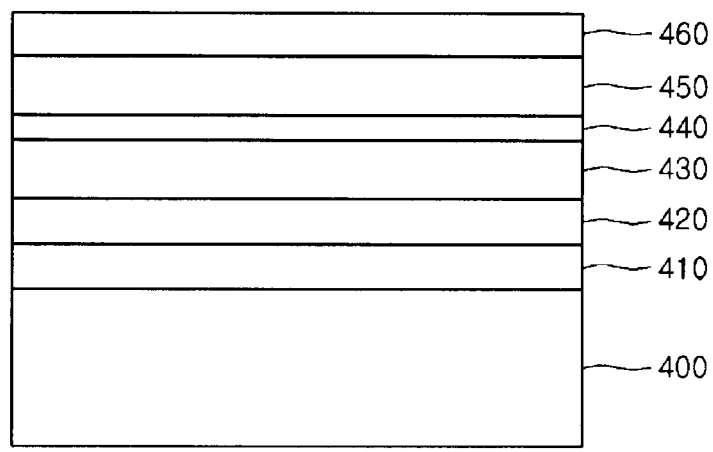

Referring to FIG. 6, an ohmic contact reflective layer 460 is formed on the second conductive semiconductor layer 450 to improve the electric and optical characteristics of the light emitting device.

The ohmic contact reflective layer 460 may include one selected from the group consisting of Rh, Au, Pt, Ni, Ag, Pd, and Al. In addition, the ohmic contact reflective layer 460 may include an alloy including one selected from the group consisting of Rh, Au, Pt, Ni, Ag, Pd, and Al.

The ohmic contact reflective layer 460 forms an ohmic contact interface, which leads to low contact resistance in the vertical direction, with respect to the second conductive semiconductor layer 450, so that the current can be easily injected in the vertical direction. The ohmic contact reflective layer 460 can be formed by using a typical evaporator.

Figure 7:
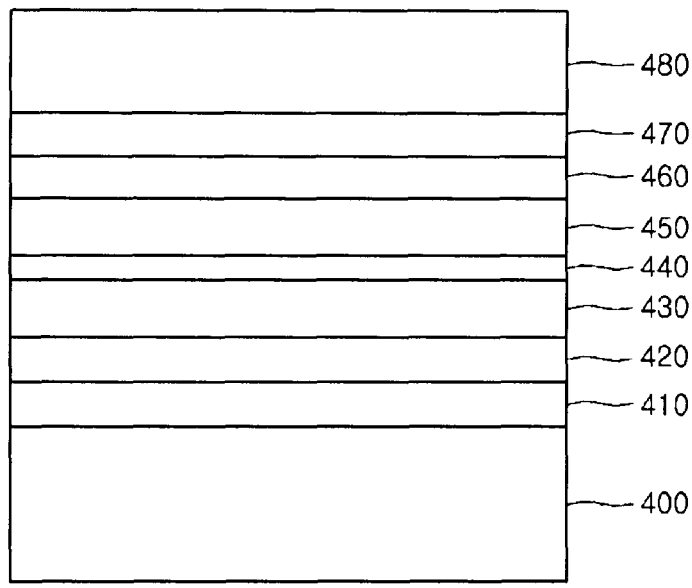

Referring to FIG. 7, a conductive support substrate 480 is bonded onto the ohmic contact reflective layer 460 through a conductive wafer bonding layer 470.

That is, the conductive wafer bonding layer 470 is previously formed on the ohmic contact reflective layer 460 and then the conductive support substrate 480 is bonded onto the ohmic contact reflective layer 460 through the conductive wafer bonding layer 470. However, according to another embodiment, the conductive wafer bonding layer 470 is previously formed on the bottom surface of the conductive support substrate 480 and then the conductive support substrate 480 is bonded onto the ohmic contact reflective layer 460 through the conductive wafer bonding layer 470.

Preferably, the conductive wafer bonding layer 470 includes a material having predetermined pressure and a melting point in the range of 200° C. to 600° C. For instance, the conductive wafer bonding layer 470 may include at least one selected from the group consisting of Au, Sn, Pd, In, Ag, Ti, Ni, Cr, and Pt.

A support substrate including silicon (Si) doped with impurities to have conductivity can be employed as the conductive support substrate 480.

Figure 8:
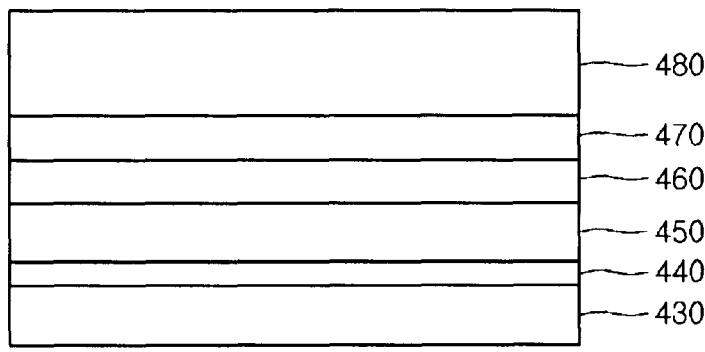

Referring to FIG. 8, as the wafer bonding process to the conductive support substrate 480 has been completed, the silicon growth substrate 400 is removed.

The sapphire growth substrate can be removed through the laser liftoff, mechanical grinding or chemical etching. The sapphire growth substrate used in the related art has the hexagonal crystal structure of $Al_2O_3$, so the sapphire growth substrate is very rigid. Thus, if the mechanical grinding or the chemical etching is used to remove the sapphire growth substrate, the process cost and process time may be increased, so the laser liftoff scheme is mainly employed to remove the sapphire growth substrate. However, the laser liftoff scheme generates the high temperature, so that the epitaxial plane of the light emitting structure may be damaged by the high temperature. As a result, the reliability of the light emitting diode may be degraded.

However, the silicon growth substrate 400 used in the embodiment can be easily removed through the typical etching scheme, in particular, the wet etching scheme, so that the problem derived from the laser liftoff scheme can be solved.

Figure 9:
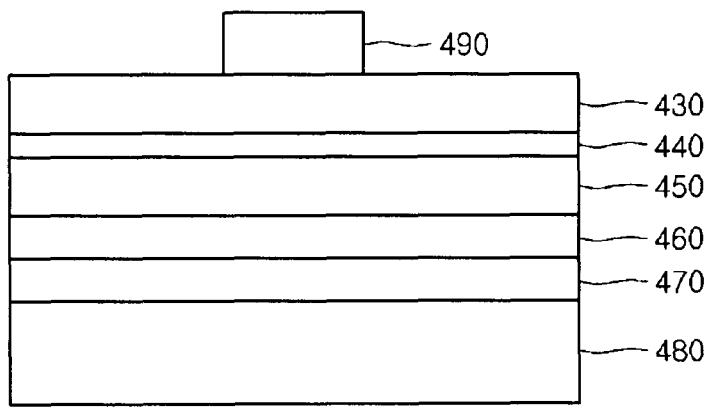

Referring to FIG. 9, the first and second buffer layers 410 and 420 are removed and a first electrode layer 490 is formed on the first conductive semiconductor layer 430.

As a result, the vertical type light emitting device is manufactured.

According to the semiconductor device of the embodiment, the crack or the warpage may not occur in the light emitting device layer, so that the reliability and brightness of the light emitting device can be remarkably improved.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

INDUSTRIAL APPLICABILITY

The embodiments are applicable for various semiconductor devices including light emitting devices used as light sources.

The invention claimed is:

1. A semiconductor device comprising:
   a growth substrate;
   a first buffer layer having a compositional formula of $Re_xSi_y$ ($0 \leq x \leq 2$, $0 \leq y \leq 2$) over the growth substrate; and
   a group III nitride-based epitaxial semiconductor layer having a compositional formula of $In_xAl_yGa_{1-x-y}N$ ($0 \leq x$, $0 \leq y$, $x+y \leq 1$) over the first buffer layer.

2. The semiconductor device of claim 1, further comprising a second buffer layer having a compositional formula of $In_xAl_yGa_{1-x-y}N$ ($0 \leq x$, $0 \leq y$, $x+y \leq 1$) between the growth substrate and the first buffer layer or between the first buffer layer and the group III nitride-based epitaxial semiconductor layer.

3. The semiconductor device of claim 1, wherein the growth substrate includes one selected from the group consisting of sapphire, SiC, ZnO, GaAs, GaN, Si, $LiAlO_2$, and $LiGaO_2$.

4. The semiconductor device of claim 1, wherein the growth substrate includes a silicon growth substrate.

5. The semiconductor device of claim 1, wherein the first buffer layer includes $ReSi_{1.75}$ or $ReSi_2$.

6. The semiconductor device of claim 2, wherein the second buffer layer includes GaN or AlN.

7. The semiconductor device of claim 1, wherein the group III nitride-based epitaxial semiconductor layer includes a first conductive semiconductor layer, an active layer and a second conductive semiconductor layer.

8. A semiconductor device comprising:
a silicon growth substrate;
a first buffer layer having a compositional formula of $Re_xSi_y$ ($0 \leq x \leq 2$, $0 \leq y \leq 2$) over the silicon growth substrate;
a second buffer layer including GaN or AlN over the first buffer layer; and
a first conductive semiconductor layer, an active layer and a second conductive semiconductor layer over the second buffer layer.

9. The semiconductor device of claim 8, further comprising an ohmic contact layer over the second conductive semiconductor layer.

10. The semiconductor device of claim 9, wherein the ohmic contact reflective layer includes one selected from the group consisting of Rh, Au, Pt, Ni, Ag, Pd, and Al. In addition, the ohmic contact reflective layer includes an alloy including one selected from the group consisting of Rh, Au, Pt, Ni, Ag, Pd, and Al.

11. The semiconductor device of claim 9, further comprising a conductive wafer bonding layer over the ohmic contact layer.

12. The semiconductor device of claim 11, wherein the conductive wafer bonding layer includes at least one selected from the group consisting of Au, Sn, Pd, In, Ag, Ti, Ni, Cr, and Pt.

13. The semiconductor device of claim 11, further comprising a conductive support substrate over the conductive wafer bonding layer.

14. The semiconductor device of claim 13, wherein the conductive support substrate includes silicon doped with impurities to have conductivity can be employed as the conductive support substrate.

15. A method of manufacturing a semiconductor device, the method comprising:
forming a buffer layer including a compound having a compositional formula of $Re_xSi_y$ ($0 \leq x \leq 2$, $0 \leq y \leq 2$) over a growth substrate;
forming a light emitting semiconductor layer including a first conductive semiconductor layer, an active layer and a second conductive semiconductor layer over the buffer layer;
forming an ohmic contact reflective layer over the second conductive semiconductor layer;
forming a conductive wafer bonding layer and a conductive support substrate over the ohmic contact reflective layer;
removing the growth substrate and the buffer layer; and
forming a first electrode layer over the first conductive semiconductor layer.

16. The method of claim 15, wherein the buffer layer includes a first buffer layer having a compositional formula of $Re_xSi_y$ ($0 \leq x \leq 2$, $0 \leq y \leq 2$) and a second buffer layer having a compositional formula of $In_xAl_yGa_{1-x-y}N$ ($0 \leq x$, $0 \leq y$, $x+y \leq 1$).

17. The method of claim 15, wherein the growth substrate includes one selected from the group consisting of sapphire, SiC, ZnO, GaAs, GaN, Si, $LiAlO_2$, and $LiGaO_2$.

18. The method of claim 15, wherein the growth substrate includes a silicon growth substrate.

19. The method of claim 16, wherein the first buffer layer includes $ReSi_{1.75}$ or $ReSi_2$.

20. The method of claim 16, wherein the second buffer layer includes GaN or AlN.

* * * * *